United States Patent [19]

Lee et al.

[11] Patent Number: 4,602,421
[45] Date of Patent: Jul. 29, 1986

[54] LOW NOISE POLYCRYSTALLINE SEMICONDUCTOR RESISTORS BY HYDROGEN PASSIVATION

[75] Inventors: Joseph Y. Lee, Agoura; Michael H. Kriegel, Santa Monica; Thomas Y. Chuh, Encinitas, all of Calif.

[73] Assignee: The United States of America as represented by the Secretary of the Air Force, Washington, D.C.

[21] Appl. No.: 726,558

[22] Filed: Apr. 24, 1985

[51] Int. Cl.$^4$ .................. H01L 21/477; H01L 21/26; H01H 10/00
[52] U.S. Cl. ................. 29/576 C; 29/576 B; 29/610 R; 29/590; 357/59; 148/DIG. 136
[58] Field of Search ............ 148/DIG. 136, DIG. 3; 29/576 B, 576 C, 610 R, 590; 357/51, 59

[56] References Cited

U.S. PATENT DOCUMENTS

| | | | |
|---|---|---|---|
| 3,308,528 | 3/1967 | Bullard et al. | 29/155.7 |
| 3,765,940 | 10/1973 | Hentzschel | 117/227 |
| 4,154,873 | 4/1979 | Hickox et al. | 148/DIG. 3 |
| 4,210,996 | 7/1980 | Amemiya et al. | 29/610 R |
| 4,214,917 | 1/1980 | Clark et al. | 29/577 C |
| 4,420,766 | 12/1983 | Hasten | 357/51 |
| 4,516,313 | 5/1985 | Turi et al. | 29/571 |

OTHER PUBLICATIONS

U.S. application Ser. No. 325,441, by Joseph Y. M. Lee entitled Polycrystalline Semiconductor Resistor with Profiled Ion Implantation for Reducing Noise.
IBM Technical Disclosure Bulletin, vol. 15, No. 9, dated Feb. 1973.

Primary Examiner—Brian E. Hearn
Assistant Examiner—J. Callahan
Attorney, Agent, or Firm—Donald J. Singer; William G. Auton

[57] ABSTRACT

Low noise polycrystalline silicon resistors are fabricated in the following sequence:
(1) deposit an appropriate thickness of polysilicon (e.g. 400 nm) on top of an oxidized wafer
(2) resistor doping by ion implantation (e.g. phosphorous)
(3) heavy doping of the end-contact regions of the polysilicon resistor by high-dose ion implantation
(4) patterning the polysilicon resistor
(5) oxidation/annealing the polysilicon resistor
(6) open contacts to the polysilicon resistor
(7) aluminum metallization to form ohmic contacts
(8) a long (e.g. 3 hours) low temperature (e.g. at 375°) pure hydrogen annealing to passivate the interface states in the polysilicon resistor. Polyresistors processed this way have a noise figure that is about a factor of three lower than samples processed otherwise. The low temperature post metallization annealing in pure hydrogen passivates the interfaces of polyresistors, reducing the 1/f noise normally generated therein.

1 Claim, 2 Drawing Figures

LOW NOISE POLYCRYSTALLINE SEMICONDUCTOR RESISTORS BY HYDROGEN PASSIVATION

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to the manufacture of semiconductors and specifically to a process of fabricating low noise polycrystalline silicon resistors.

The manufacture of semiconductors and resistor commonly contains, as one step, an annealing process, as shown in U.S. Pat. No. 3,765,940 issued to Hentzchel on Oct. 16, 1973 and U.S. Pat. No. 3,308,528 issued to Bullard et al on Mar. 14, 1967, the disclosure of which are incorporated by reference.

Polycrystalline silicon (polysilicon) resistors are well known in the art and serve as important elements in some semiconductor imagers and memory chips. However, these resistors produce 1/f noise. Most of the theories of 1/f noise suggest that this noise originates at interfaces where there are carrier traps.

In view of the foregoing discussion, it is apparent that there currently exists the need of a fabrication process that reduces the noise generated at the interfaces of polysilicon resistors. The present invention is directed towards satisfying that need.

SUMMARY OF THE INVENTION

The present invention is a process of fabicating low noise polycrystalline silicon resistors. This process includes steps to passivate the resistors to reduce the 1/f noise which is routinely observed in prior art devices.

As mentioned above, most theories suggest that the 1/f noise originates in the interfaces where there are carrier traps. The process of the present invention includes a step to passivate these interfaces with hydrogen in a unique treatment which serves to demonstratably improve the 1/f noise characteristics of polysilicon resistors.

The low noise crystalline silicon resistors are fabricated in the following sequence:

(1) deposit an appropriate thickness of polysilicon film on an oxidized wafer
(2) resistor doping of the polysilicon film by ion implantation
(3) heavy doping of the end-contact regions of the polysilicon film by high-dose ion implantation
(4) patterning the polysilicon resistor
(5) oxidation/annealing of the polysilicon resistor
(6) open contacts to the polysilicon resistor
(7) aluminum metallization to form ohmic contacts
(8) a long (e.g. 3 hours) low temperature (e.g. at 375° C.) pure hydrogen annealing to passivate the interface states in polysilicon resistors.

Polyresistors that are processed this way have a noise figure that is about a factor of 3 lower than samples processed otherwise.

It is a principal object of the present invention to provide a new and improved process of fabricating polycrystalline silicon resistors.

It is another object of the present invention to provide a process to reduce the 1/f noise which is observed in polysilicon resistors.

It is another object of the present invention to provide a treatment of the interfaces of polysilicon resistors which reduces the noise generated therein.

It is another object of the present invention to provide a low temperature annealing process of comparatively long duration in hydrogen to passivate the interface states of polysilicon resistors.

These advantages with other objects, features, and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a process of fabricating low noise polycrystalline silicon or polysilicon resistors which includes a low temperature annealing process of comparatively long duration to passivate the interfaces.

Figure 1:
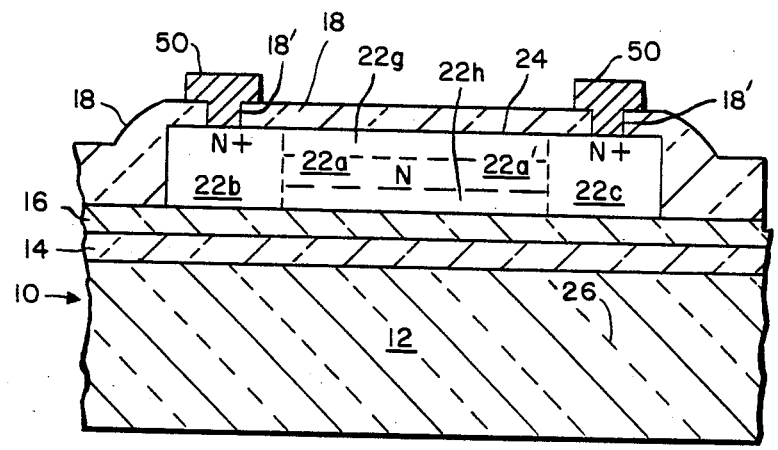
FIG. 1 is a cross-sectional view of a polycrystalline silicon resistor.

In order to understand the fabrication process, it is necessary to observe the elements of a state-of-the-art polysilicon resistor. FIG. 1 is a simplified cross-sectional view of a polycrystalline silicon resistor 22. This figure shows a semiconductor silicon substrate 12 and overlying dielectric layers 14, 16, 18 comprising silicon dioxide and the polysilicon resistor 22a–h. A polycrystalline silicon resistor 22a–h is surrounded by the dielectric layers 18 and 16 and overlies the silicon substrate 12. The resistor 22a–h is preferably formed by ion implantation of dopants, either donor-type or acceptor-type. For illustration purposes, donor-type dopants are described here. Donor-type dopants (for example, arsenic) are implanted in a middle resistor portion 22a and heavily implanting donor-type dopants in contact portions 22b, 22c at either end of the resistor 22a–h.

The example used in FIG. 1 is from a patent application filed by Joseph Y. M. Lee, entitled "Polycrystalline Semiconductor Resistor with Profiled Ion Implantation for Reducing Noise", in U.S application Ser. No. 325,441, the disclosure of which is hereby incorporated by reference.

The above referenced Lee application includes an overlying dielectric layer 18 which has contact holes 18' formed therein through which metal contacts 50 may be formed to each of the heavily doped contact ends 22b, c of the resistor 22a–h. Electrons introduced at one of the ends 22b, 22c flow through the resistor portion 22a to the opposite end.

The polycrystalline silicon resistor of FIG. 1 is presented as an example, and is depicted as originally disclosed in the above-identified patent application. However, when fabricating low noise polycrystalline silicon resistors using the process of the present invention, there is no need to separate 22a, 22g and 22h as shown in the example of FIG. 1. Additionally, the dielectric layer 26 shown in FIG. 1 is not needed in the low noise polycrystalline silicon resistors produced by the present invention.

Figure 2:
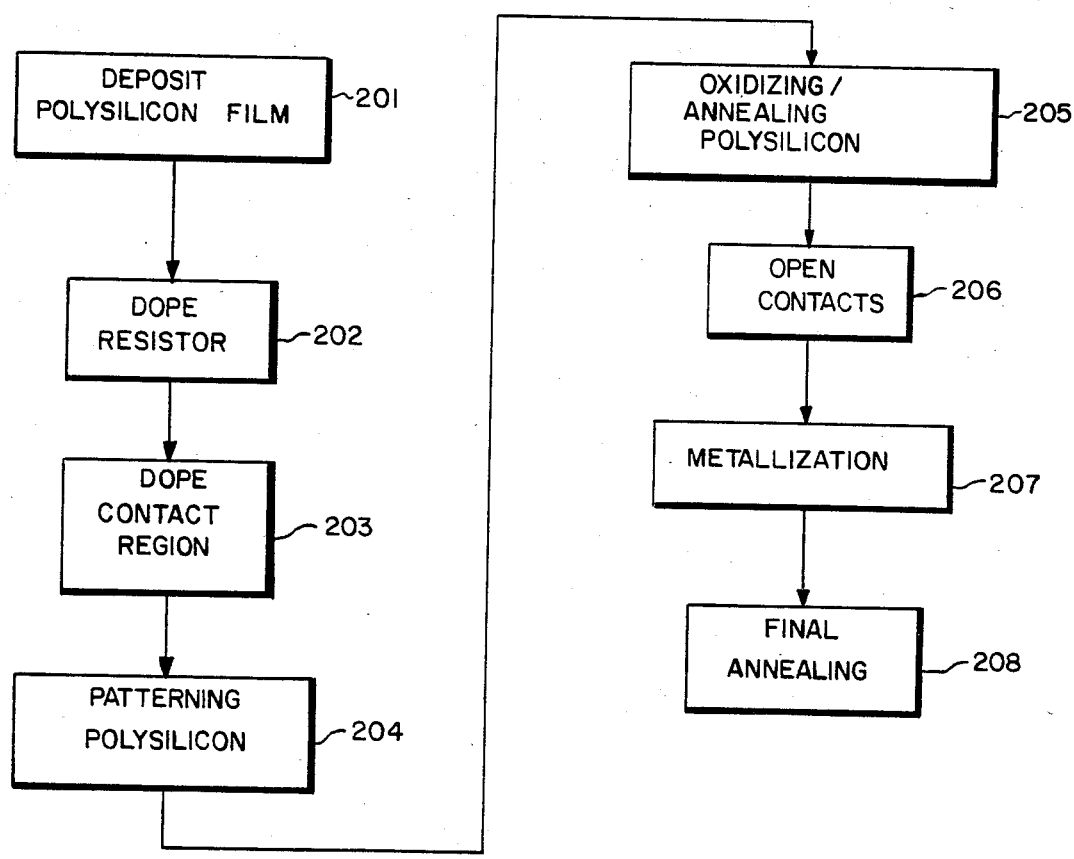
FIG. 2 is a block diagram of the fabrication process of the present invention.

FIG. 2 is a block diagram which illustrates the fabrication process that is the subject of the present invention.

The first step of the process is the deposit polysilicon film step 201. This is a process known in the art and simply refers to depositing an appropriate thickness of polysilicon on top of an oxidized silicon wafer upon which the integrated circuit will be fabricated. This thickness of polysilicon film is about 400 nm.

The second step of the fabrication process is the dope resistor step 202. This is a process of resistor doping by ion implantation which is performed on the area shown as layer 22a-h in the resistor 22a-h in FIG. 1. In the preferred embodiment of the present invention the dopant used is phosphorous.

The third step of the fabrication process is the dope contact region step 203. This is a process of resistor doping by ion implantation of the contact regions 22b and 22c shown in FIG. 1. Doping is a process that is known in the art, and need not be further amplified.

The fourth step of the fabrication process is the patterning of polysilicon step 204. This is a technique, known in the art, which need not be described here. The significance of this fourth step 204 is principally its order of occurence in the fabrication process.

The fifth step in the fabrication process is the oxidation/annealing of the polysilicon 205. This is the first of two annealing steps in this fabrication process. However, this fifth annealing step does not refer to the "low temperature annealing step of comparatively long duration" which is a novel treatment in the process occuring at step 8, the final annealing step 208. The fifth step of annealing the polysilicon is rather a technique, known in the art which can occur at temperatures between 850° C.-1200° C. The post-metallization annealing step 208 is a low temperature (about 375°) annealing treatment in hydrogen for comparatively long duration.

The sixth step of the fabrication process is the open contacts step 206. This step involves creating openings in the polysilicon over the areas of 22b and 22c shown in FIG. 1. This will allow the metal contacts 50 to be formed to each of the heavily doped contact ends 22b and 22c of the resistor.

The seventh step of the fabrication process is the metallization step 207. In this step the metal contacts 50 are applied to the contact ends 22b and c of the resistor. In the preferred embodiment the contacts are aluminum, but a variety of metals are known and cited in the art.

The eighth and final step of the fabrication process is the final annealing treatment 208. This step is unique in both its application and its demonstratable results.

The treatment in step 208 consists of annealing the completely fabricated polysilicon resistor in pure hydrogen at low temperature. Conventional annealing known in the art occurs most commonly at moderate temperatures between 500° C. and 450° C. in forming gas or nitrogen. The annealing treatment of the present invention is performed at about 375° C. in pure hydrogen. Additionally, the treatment is performed for a comparatively long duration: about three hours.

The principle behind the treatment, described above, is derived from the theory that the 1/f noise commonly experienced by polycrystalline silicon resistors originates at interface where there are carrier traps. The fabrication process of the invention passivates these interfaces by the long, low temperature annealing in pure hydrogen. Since the trap states are passivated, the 1/f noise is lower compared with samples processed otherwise.

Test results indicate that polyresistors processed in the method of the present invention have a noise figure that is about a factor of three lower than samples processed otherwise. This reduction of the 1/f noise is the result of the use of the low temperature post-metallization annealing step in pure hydrogen.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process of fabricating a resistor having low noise, said process consisting essentially of the steps of:
   depositing a layer of polysilicon film which has end-contact regions on top of a plurality of dielectric layers, which in turn are on top of a semiconductive substrate;
   doping the polysilicon film by ion implantation followed by heavy doping of the end-contact regions of the polysilicon film by high-dose ion implantation;
   patterning said polysilicon resistor;
   applying a first oxidation annealing treatment to said polysilicon resistor;
   providing contact openings to said polysilicon resistor at both ends of the top surface of said resistor;
   applying metal contacts in said contact openings; and
   applying a second annealing treatment to said resistor, said second annealing treatment performed in pure hydrogen at temperatures of about 375° C. for a duration of about three hours.

* * * * *